(12) United States Patent
Lu

(10) Patent No.: US 12,166,161 B2
(45) Date of Patent: Dec. 10, 2024

(54) DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Qiang Lu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/597,103

(22) PCT Filed: Dec. 17, 2021

(86) PCT No.: PCT/CN2021/138969
§ 371 (c)(1),
(2) Date: Dec. 27, 2021

(87) PCT Pub. No.: WO2023/103026
PCT Pub. Date: Jun. 15, 2023

(65) Prior Publication Data
US 2024/0038947 A1    Feb. 1, 2024

(30) Foreign Application Priority Data
Dec. 12, 2021   (CN) .......................... 202111513115.7

(51) Int. Cl.
*H01L 33/62*    (2010.01)
*H01L 23/00*    (2006.01)
*H01L 25/16*    (2023.01)

(52) U.S. Cl.
CPC .............. *H01L 33/62* (2013.01); *H01L 24/05* (2013.01); *H01L 24/13* (2013.01); *H01L 24/16* (2013.01);
(Continued)

(58) Field of Classification Search
CPC . H01L 2224/05571; H01L 2224/05552; H01L 2224/13021
See application file for complete search history.

(56) References Cited

U.S. PATENT DOCUMENTS 6,313,532 B1 *  11/2001  Shimoishizaka ....... H01L 24/13
                                                    257/793
7,164,208 B2 *  1/2007   Kainou ................... H01L 24/06
                                                    257/781
(Continued)

FOREIGN PATENT DOCUMENTS

CN    101312173 A    11/2008
CN    102254876 A    11/2011
(Continued)

OTHER PUBLICATIONS

International Search Report in International application No. PCT/CN2021/138969, mailed on Sep. 7, 2022.
(Continued)

*Primary Examiner* — Evren Seven

(57) ABSTRACT

A display panel is provided. The display panel includes a driving backplane with a connecting electrode, an insulating layer arranged on the connecting electrode, and a light-emitting unit arranged on the driving backplane. The insulating layer includes an opening exposing part of a surface of the connecting electrode. The light-emitting unit is electrically connected with a bump electrode, and the bump electrode is electrically connected with the connecting electrode through the opening. The opening has a ridge and furrow profile, which can increase an area of a sidewall of
(Continued)

the opening, such that a contact area between the bump electrode and the sidewall is increased to prevent peeling or cracking between the films.

20 Claims, 4 Drawing Sheets

(52) U.S. Cl.
CPC .. *H01L 25/167* (2013.01); *H01L 2224/05552* (2013.01); *H01L 2224/05571* (2013.01); *H01L 2224/05573* (2013.01); *H01L 2224/13021* (2013.01); *H01L 2224/13139* (2013.01); *H01L 2224/1607* (2013.01); *H01L 2224/16145* (2013.01); *H01L 2924/12041* (2013.01)

(56) References Cited

U.S. PATENT DOCUMENTS

| | | | | |
|---|---|---|---|---|
| 7,795,128 | B2* | 9/2010 | Nakatani | H01L 24/73 |
| | | | | 257/737 |
| 11,139,228 | B2* | 10/2021 | Takatsuka | H01L 23/49827 |
| 2003/0234277 | A1* | 12/2003 | Dias | H01L 24/13 |
| | | | | 257/E23.068 |
| 2005/0046025 | A1* | 3/2005 | Kanda | H01L 24/13 |
| | | | | 257/735 |
| 2013/0320522 | A1* | 12/2013 | Lai | H01L 23/3192 |
| | | | | 257/E21.585 |
| 2021/0375982 | A1 | 12/2021 | Wu et al. | |

FOREIGN PATENT DOCUMENTS

| | | |
|---|---|---|
| CN | 105739198 A | 7/2016 |
| CN | 209486440 U | 10/2019 |
| CN | 110444561 A | 11/2019 |
| CN | 112309243 A | 2/2021 |
| CN | 112447689 A | 3/2021 |
| CN | 113054086 A | 6/2021 |

OTHER PUBLICATIONS

Written Opinion of the International Search Authority in International application No. PCT/CN2021/138969, mailed on Sep. 7, 2022.

Chinese Office Action issued in corresponding Chinese Patent Application No. 202111513115.7 dated Mar. 19, 2023, pp. 1-6.

* cited by examiner

DISPLAY PANEL

FIELD OF INVENTION

The invention relates to the fields of display technologies, in particular to a display panel.

BACKGROUND OF INVENTION

In the fields of micro light-emitting diode (micro LED) displays, the LED chips are connected to a driving panel by bonding after mass transferring. Under pressure, the metal bumps of the LED chip are in close contact with the connecting electrode on the driving backplane to achieve interconnection.

In this process, in order to ensure good contact between the metal bumps on the whole surface and the connecting electrode, the bonding pressure and the size of the metal bumps are usually increased. Large concentrated stress leads to peeling or cracking between the film layers. Unsolidified or molten metal bumps are easy to flow, which may lead to a short circuit between the electrodes and cause the devices to malfunction.

Technical Problem

The embodiments of the invention provide a display panel to solve the technical problem of breakage or crack between the film layers when the existing micro LEDs are bonded with the driving backplane.

SUMMARY OF INVENTION

Technical Solutions

In order to solve the above problem, the technical solutions provided by the invention are as follows:

The embodiments of the invention provide a display panel, including:
- a driving backplane including a plurality of connecting electrodes spaced apart from each other;
- an insulating layer arranged on the connecting electrodes, wherein the insulating layer includes a plurality of openings, and wherein each of the openings exposes at least part of a surface of corresponding one of the connecting electrodes; and
- a light-emitting unit arranged on the driving backplane, wherein a side of the light-emitting unit facing the driving backplane includes a plurality of bonding terminals, wherein each of the bonding terminals is electrically connected with a bump electrode, and the bump electrode is electrically connected with one of the connecting electrodes through corresponding one of the openings;
- wherein an orthographic projection of each of the openings projected on the driving backplane has a ridge and furrow profile, and an opening area of each of the openings gradually increases along a direction away from the driving backplane; and the ridge and furrow profile is one of or more than one of a square wave shape, a wave shape, and an arc shape.

In some embodiments of the invention, an angle between a sidewall of each of the openings and the driving backplane ranges from 0 to 30 degrees.

In some embodiments of the invention, a vertical height of the sidewall of each of the openings ranges from 0.5 to 10 microns.

In some embodiments of the invention, wherein the insulating layer further includes at least two step surfaces with different heights, and the step surface is arranged around each of the openings.

In some embodiments of the invention, the step surface is parallel to a plane of the driving backplane.

In some embodiments of the invention, a step sidewall between adjacent two of the step surfaces is an inclined plane, and an angle between the step sidewall and the driving backplane ranges from 0 to 30 degrees.

In some embodiments of the invention, a vertical height between adjacent two of the step surfaces ranges from 0.5 to 10 microns.

In some embodiments of the invention, material of the insulating layer includes an organic material.

The embodiments of the invention also provide another display panel, including:
- a driving backplane including a plurality of connecting electrodes spaced apart from each other;
- an insulating layer arranged on the connecting electrodes, wherein the insulating layer includes a plurality of openings, and wherein each of the openings exposes at least part of a surface of corresponding one of the connecting electrodes; and
- a light-emitting unit arranged on the driving backplane, wherein a side of the light-emitting unit facing the driving backplane includes a plurality of bonding terminals, wherein each of the bonding terminals is electrically connected with a bump electrode, and the bump electrode is electrically connected with one of the connecting electrodes through corresponding one of the openings;
- wherein an orthographic projection of the opening projected on the driving backplane has a ridge and furrow profile.

In some embodiments of the invention, an opening area of the opening gradually increases along a direction away from the driving backplane.

In some embodiments of the invention, an angle between a sidewall of each of the openings and the driving backplane ranges from 0 to 30 degrees.

In some embodiments of the invention, a vertical height of the sidewall of each of the openings ranges from 0.5 to 10 microns.

In some embodiments of the invention, wherein the insulating layer further includes at least two step surfaces with different heights, and the step surface is arranged around each of the openings.

In some embodiments of the invention, the step surface is parallel to a plane of the driving backplane.

In some embodiments of the invention, a step sidewall between adjacent two of the step surfaces is an inclined plane, and an angle between the step sidewall and the driving backplane ranges from 0 to 30 degrees.

In some embodiments of the invention, a vertical height between adjacent two of the step surfaces ranges from 0.5 to 10 microns.

In some embodiments of the invention, the ridge and furrow profile is any one of square wave shape, wave shape and arc shape.

In some embodiments of the invention, material of the insulating layer includes an organic material.

In some embodiments of the invention, material of the bump electrode includes any one of solder paste and silver.

In some embodiments of the invention, a bottom wall is a surface of the connecting electrode exposed in the opening.

Beneficial Effect

The display panel provided by the embodiments of the invention includes a driving backplane with a plurality of connecting electrodes spaced apart from each other, an insulating layer arranged on the connecting electrodes, and a light-emitting unit arranged on the driving backplane. The insulating layer includes a plurality of openings, each of the openings exposing at least part of a surface of corresponding one of the connecting electrodes. A side of the light-emitting unit facing the driving backplane includes a plurality of bonding terminals, and the bonding terminals are electrically connected with the connecting electrodes through the corresponding openings. An orthographic projection of the opening projected on the driving backplane has a ridge and furrow profile to increase an area of a sidewall of the opening, and then increase a contact area between the bump electrode and the sidewall, so as to reduce the pressure on the sidewall, reduce the stress at the junction of the insulating layer and the connecting electrode, and avoid peeling or cracking between the film layers.

DRAWINGS

DETAILED DESCRIPTION OF EMBODIMENTS

Figure 1A:
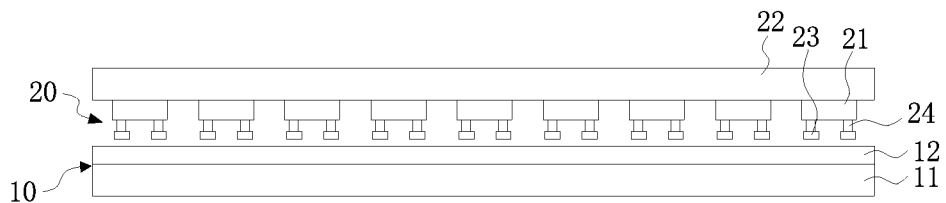
FIG. 1A is a schematic structural view of bonding of a driving backplane and a light-emitting panel provided by an embodiment of the present invention.

The description of the following embodiments refers to the accompanying drawings to illustrate specific embodiments that can be implemented in the present invention. The directional terms mentioned in this invention, such as "upper", "lower", "front", "rear", "left", "right", "inside", "outside", "side" etc., are merely refer to the direction of the accompanying drawing. Therefore, the directional terms used are used to illustrate and understand the present invention, rather than to limit the present invention. In the drawings, elements with similar structures are indicated by the same reference numerals.

In the description of this application, it should be understood that the term "a plurality of" in the description of this application refer to two or more than two, unless otherwise expressly and specifically limited. In the present application, unless otherwise clearly specified and limited, a first feature being "above" a second feature may include the first directly contacted with the second feature, or not directly contacted, but contacted through other features between them. Moreover, a first feature being "on" a second feature includes that the first feature is directly above and obliquely above the second feature, or only indicates that a horizontal height of the first feature is higher than a horizontal height of the second feature.

The following disclosure provides many different embodiments or examples to implement different structures of the present application. In order to simplify the disclosure of the present application, the components and configurations of specific examples are described below. Certainly, those embodiments are merely examples and are not intended to limit the present application. In addition, the present application may duplicate the reference numbers and/or reference letters in different examples, such duplication is for the purpose of simplicity and clarity and is not indicative of a relationship between the various embodiments and/or configurations discussed. In addition, the present application provides examples of various specific processes and materials, but those skilled in the art can realize that other process applications and/or other materials may be used.

Figure 1B:
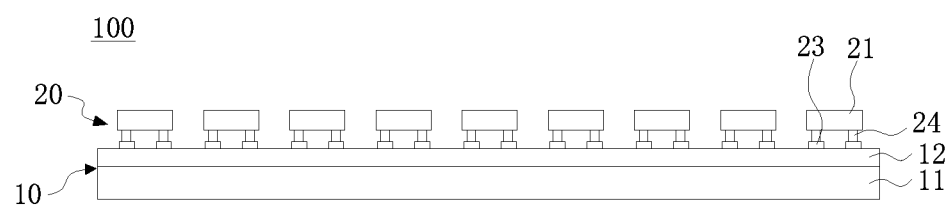
FIG. 1B is a schematic structural view of a film lamination configuration of a display panel provided by an embodiment of the present invention.

As shown in FIGS. 1A and 1B, the embodiments of the present invention provide a display panel 100, including a driving backplane 10 and a light-emitting panel 20. The driving backplane 10 includes a first substrate 11 and a plurality of pixel driving circuits 12 arranged on the first substrate 11. The light-emitting panel 20 includes a plurality of light-emitting units 21. A number of the driving backplanes 10 may be one, a number of the light-emitting panels 20 may be one or more than one, and a plurality of the light-emitting panels 20 may be bonded to the same driving backplane 10 to achieve the narrow bezel display or the seamless tiling of a plurality of the display panels 100.

Specifically, the light-emitting unit 21 of the light-emitting panel 20 may be first formed on the second substrate 22, and then bonded and connected with a corresponding pixel driving circuit 12 provided on the driving backplane 10 by transfer. The pixel driving circuit 12 drives the light-emitting unit 21 to emit light. A side of the light-emitting unit 21 facing the driving backplane 10 includes a plurality of bonding terminals 24. The bonding terminal 24 is electrically connected with bump electrode 23, and the bonding terminal 24 is bonded and connected with a connecting electrode provided on the driving backplane 10 through the bump electrode 23. Material of the bump electrode 23 includes any one of conductive materials such as solder paste and silver glue. In the bonding process, a conductive material, such as a solder paste, may be dispensed on the bonding terminal 24 or the connecting electrode, and then the driving backplane 10 and the light-emitting panel 20 may be bonded by alignment, reflow, and other processes. After the bonding is completed, the second substrate 22 may be removed, as shown in FIG. 1B.

Figure 2:
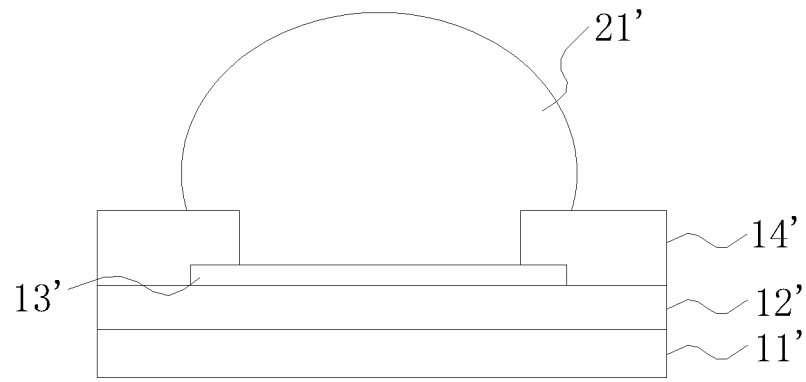
FIG. 2 is a schematic view of a conventional metal bump at an opening of an insulating layer.
Figure 3:
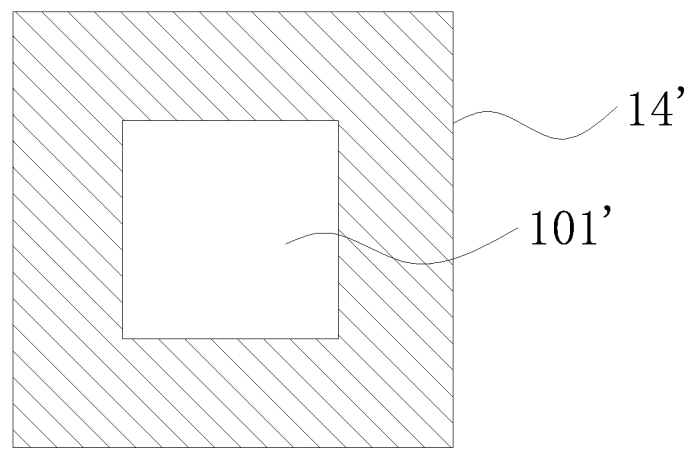
FIG. 3 is a schematic plan view of an opening of an insulating layer of the conventional art.

Referring to FIGS. 2 and 3. FIG. 2 is a schematic view of a conventional metal bump at an opening of an insulating layer, and FIG. 3 is a schematic plan view of an opening of an insulating layer of the conventional art. Generally, the bonding between the driving backplane and the light-emitting panel is achieved by bonding a connecting electrode 13', which is electrically connected with a pixel driving circuit 12' on a first substrate 11', and a bonding terminal on a light-emitting unit 21' through a metal bump 21'. The pixel driving circuit 12' is provided with an insulating layer 14', the insulating layer 14' is provided with an opening 101', and the opening 101' exposes the connecting electrode 13'. In the bonding process, due to an uneven surface between the driving backplane, the light-emitting panel and the equipment platform, gaps between the light-emitting unit and the driving backplane in different areas are different, and the pressure on the light-emitting units are also different. In order to ensure good electrical contact between the bonding terminals on all light-emitting units and the connecting electrodes 13', the bonding pressure between the light-emitting units and the driving backplanes, and a size of the metal bump 21' are usually increased. However, in this way, peeling or cracking is easy to occur at the junction of the insulating layer 14' and the connecting electrode 13'. Moreover, the unsolidified or molten metal will also overflow from the opening 101', resulting in a short circuit between the adjacent connecting electrodes 13'.

The embodiments of the present invention address the above-mentioned defects by making improvements to the structure of the insulating layer 14', so as to solve the problem that peeling or cracking may occur between the film layers.

Figure 4:
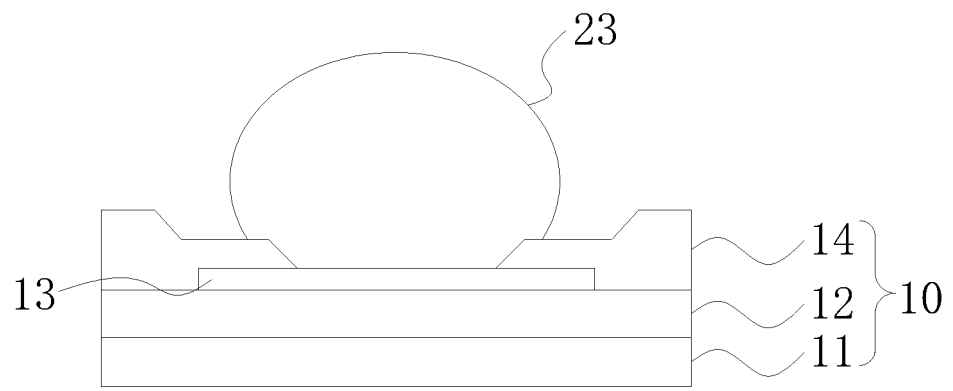
FIG. 4 is a schematic view of a lamination of a bump electrode at an opening of an insulating layer provided by an embodiment of the present invention.
Figure 5:
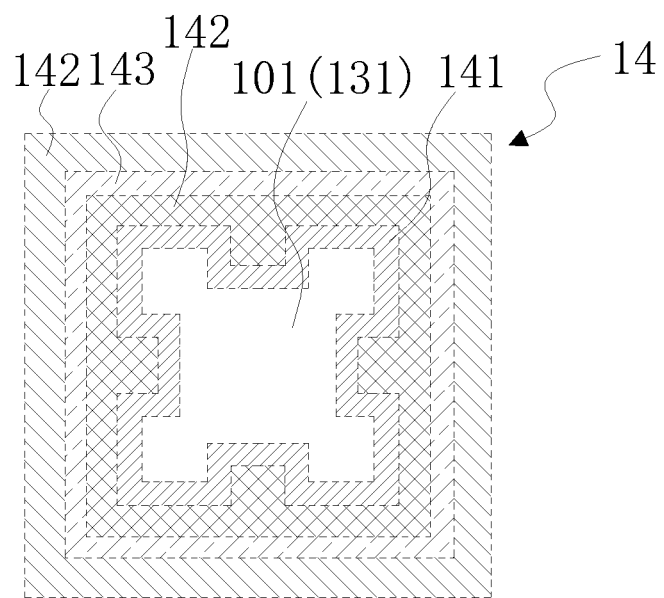
FIG. 5 is a schematic plan view of an opening of an insulating layer provided by an embodiment of the present invention.

Referring to FIGS. 4 and 5. FIG. 4 is a schematic view of a lamination of a bump electrode at an opening of an insulating layer provided by an embodiment of the present invention, and FIG. 5 is a schematic plan view of an opening of an insulating layer provided by an embodiment of the present invention. The display panel 100 of the embodiments of the invention includes a driving backplane 10 and light-emitting units 21 arranged on the driving backplane 10. In the embodiments of the invention, the light-emitting units 21 may be micro-LED light-emitting units. The light-emitting units 21 are bonded to the driving backplane 10 through a bonding technology after a mass transfer. In other embodiments, the display panel 100 may also be an OLED display panel, and the light-emitting units 21 are OLED light-emitting units. The display panel 100 may also be a LCD display panel, the driving backplane 10 may be applied to a direct back-lit backlight module, and the light-emitting units 21 are a light-emitting source of the direct back-lit backlight module.

The driving backplane 10 further includes a connecting electrode 13, the connecting electrode 13 is arranged on a pixel driving circuit 12. The connecting electrode 13 is electrically connected to the pixel driving circuit 12, and an insulating layer 14 is arranged on the connecting electrode 13 and the pixel driving circuit 12. In addition to insulation, the insulating layer 14 is also used to provide a planar surface and protect the pixel driving circuit 12.

The insulating layer 14 includes a plurality of openings 101, and the opening 101 exposes at least part of a surface of a corresponding the connecting electrode. A side of the light-emitting unit 21 facing the driving backplane 10 includes a plurality of bonding terminals. Each of the bonding terminals 24 is bonded with the connecting electrode 13 through a bump electrode 23, and the bump electrode 23 is electrically connected with one of the connecting electrodes 13 through corresponding one of the openings 101.

Figure 6:
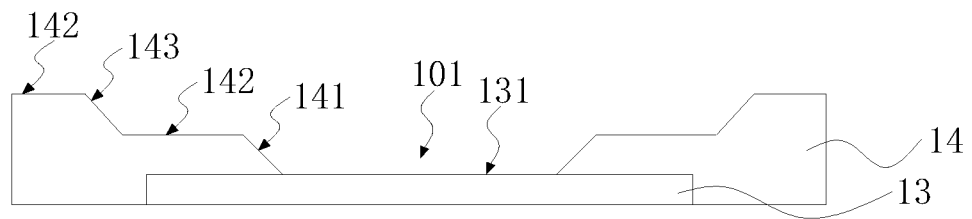
FIG. 6 is a schematic cross-sectional view of an opening of an insulating layer provided by an embodiment of the present invention.

Referring to FIG. 5 and FIG. 6. FIG. 6 is a schematic cross-sectional view of an opening of an insulating layer provided by an embodiment of the present invention. An orthographic projection of the opening 101 of the embodiments of the invention projected on the driving backplane 10 has a ridge and furrow profile, i.e., an edge of a bottom wall 131 is ridge and furrow. In an embodiment of the present invention, the bottom wall 131 is a surface of the connecting electrode 13 exposed in the opening 101.

Figure 7:
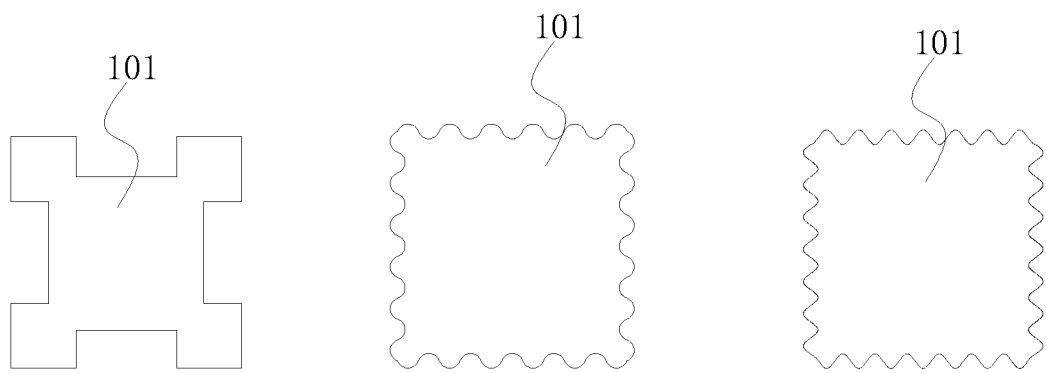
FIG. 7 is a pattern of an opening provided by an embodiment of the present invention.

Referring to FIG. 7, FIG. 7 is a pattern of an opening provided by an embodiment of the present invention. The ridge and furrow profile is one of or more than one of square wave shape, wave shape, and arc shape, but is not limited to these, and may also be other ridge and furrow shapes such as broken line shapes. The opening profile illustrated in FIG. 7 is a regularly arranged ridge and furrow profile. In other embodiments, the opening profile may also be a shaped ridge and furrow profile, i.e., the profile on each side of the opening may be arranged alternately in any pattern such as square wave shape, wave shape, or arc shape, and/or dimensions of the depressions on each side of the opening may be different, and dimensions of the protrusions may also be different. The dimensions mentioned in the embodiments include shape, depression depth/protrusion depth, arc length/side length, radius of curvature, etc. It can be understood that in the opening pattern shown in FIG. 7, a number of depressions and protrusions on the corresponding side of the opening with different patterns is only an exemplary illustration and does not represent the actual number of depressions and protrusions.

Referring to FIG. 5 and FIG. 3, taking a square wave profile as an example, compared with a square shape edge in FIG. 3, when the edge of the bottom wall 131 is a square wave, the edge on each side of the bottom wall 131 have more protrusions and depressions, and the extra protrusions and depressions increase the perimeter of the edge on each side. Since the bottom end of the sidewall 141 is in contact with the edge of the bottom wall 131, thus the shape enclosed by the bottom end of the sidewall 141 is the shape of the edge of the bottom wall 131. The top end of the sidewall 141 is formed by the bottom end extending upwardly, so the shape enclosed by the top end of the sidewall 141 is similar or the same as the shape enclosed by its bottom end. Therefore, the sidewall 141 also has protrusions and depressions corresponding to the bottom wall 131, and the protrusions and depressions increase the surface area of the sidewall 141 relative to the surface area of the sidewall of the opening in FIG. 3. Compared with the conventional square or rhombic opening, since the bottom wall 131 of the opening 101 in the embodiments of the present invention has a ridge and furrow profile, the surface area of the sidewall 141 of the opening 101 increases a lot, so that the surface contact area of the bump electrode 23 and the sidewall 141 of the opening 101 may be increased.

Material of the bump electrode 23 of the embodiments of the invention includes conductive materials such as a solder paste and a silver glue. The conductive materials such as molten solder paste and silver glue used for bonding belong to non-Newtonian fluids. During bonding, the pressure is transmitted to the sidewall 141 of the opening 101. Under constant pressure, increasing the surface contact area can reduce the pressure on the sidewall 141 of the opening 101, which reduces the risk of peeling and breakage of the film layer at the junction of the film layer and the connecting electrode 13 where the sidewall 141 of the opening 101 is located. In the embodiment of the invention, the sidewall 141 of the opening 101 is formed after the opening 101 is patterned in the insulating layer 14.

Furthermore, an opening area of the opening 101 gradually increases along a direction away from the driving backplane 10, i.e., the sidewall 141 on at least one side of the opening 101 is inclined. Namely, the sidewall 141 on at least one side is not perpendicular to the surface on which the driving backplane 10 is located. Preferably, all sidewalls 141 of the opening 101 are inclined in a certain slope.

There will be a very high proportion of particle fillers in the solder paste and silver glue. Compared with the contact with a vertical plane, when it contacts with the inclined sidewall 141, the particles are more likely to slide or roll, and then absorb and lose part of the stress. Specifically, an angle between the sidewall 141 of the opening 101 and the driving backplane 10 ranges from to 30 degrees, which has a good effect of absorbing and losing stress.

Referring to FIG. 6, in the embodiments of the invention, a part of the insulating layer 14 around the opening 101 may be configured in a stepped shape to prevent the overflow of the unsolidified or molten bump electrode 23 from causing a short circuit between the electrodes. Specifically, the insulating layer 14 further includes at least two step surfaces 142 with different heights, and the step surface 142 is arranged around each of the openings 101. When an excess of unsolidified or molten state metal flows in all directions and when it is about to fill the opening 101, the step surface 142 is designed to act as a buffer to avoid overflow of excess unsolidified or molten state metal to the adjacent connecting electrodes 13, resulting in a short circuit between adjacent connecting electrodes 13 and a decrease in transmittance.

Furthermore, the step surface 142 is arranged parallel to the driving backplane 10, and the horizontally arranged step surface 142 can support a certain amount of unsolidified or molten metal. The step sidewall 143 between adjacent two step surfaces 142 may be an inclined plane. The step sidewall 143 is arranged obliquely in a direction away from the opening 101. An angle between the step sidewall 143 and the driving backplane 10 ranges from to 30 degrees, which makes the particles more likely to slide or roll, and then absorb and lose part of the stress.

A vertical height between the adjacent two step surfaces 142 ranges from 0.5 to 10 microns, and a vertical height of the sidewall 141 of the opening 101 ranges from 0.5 to 10 microns. If a thickness of the insulating layer 14 is too thick, it is not conducive to the thin design of the display panel. If the thickness is too thin, the side walls 141 of the opening 101 and the step side walls 143 are not effective in improving the stress.

The insulating layer 14 may include an organic material, and the flatness of the surface of the organic material is better during film formation. The insulating layer 14 can form a patterned shape through a mask process via a halftone mask. The halftone mask may include at least two light transmission areas with different light transmittance, which respectively corresponds to the opening 101 and the step surface 142, so as to form the insulating layer 14 with different thickness.

The pixel driving circuit according to the embodiments of the invention includes a plurality of thin-film transistors and a capacitor, which may be 3T1C (three thin-film transistors and one capacitor) architecture, 7T1C (seven thin-film transistors and one capacitor) architecture, or 8T1C (eight thin-film transistors and one capacitor) architecture.

In view of the above, the embodiments of the invention provide a display panel 100, including a driving backplane 10 with a plurality of connecting electrodes 13 spaced apart from each other, an insulating layer 14 arranged on the connecting electrodes 13, and a light-emitting unit 21 arranged on the driving backplane 10. The insulating layer 14 includes a plurality of openings 101, each of the openings exposing at least part of a surface of corresponding one of the connecting electrodes 13. The light-emitting unit 21 includes a plurality of bonding terminals 24 on the side facing the driving backplane 10. A side of the light-emitting unit 21 facing the driving backplane 10 includes a plurality of bonding terminals 24, which are electrically connected with a plurality of bump electrodes 23, the bump electrodes 23 electrically connected with the connecting electrodes 13 through the corresponding openings 101. An orthographic projection of the opening 101 projected on the driving backplane has a ridge and furrow profile to increase an area of a sidewall 141 of the opening 101, and then increase a contact area between the bump electrode 23 and the sidewall 141, so as to reduce the pressure on the sidewall 141, reduce the stress at the junction of the insulating layer 14 and the connecting electrode 13, and avoid peeling or cracking between the film layers.

In the above embodiments, the description of each embodiment has its own focus, and the parts that are not described in detail in a particular embodiment can be found in the relevant descriptions of other embodiments.

The above description provides a detailed description of a display panel provided by the embodiments of the present invention, and specific examples have been applied in this text to illustrate the principles and implementation of the present invention. The above embodiments are described only to help understand the technical solution of this invention and its core ideas. A person of ordinary skill in the art should understand that he/she is still possible to modify the technical solution described in the above embodiments, or to replace some of the technical features. And these modifications or replacements do not make the essence of the corresponding technical solutions out of the scope of the technical solutions of the embodiments of the present invention.

What is claimed is:

1. A display panel comprising:
    a driving backplane comprising a plurality of connecting electrodes spaced apart from each other;
    an insulating layer arranged on the connecting electrodes, wherein the insulating layer comprises a plurality of openings, and each of the openings exposes at least part of a surface of corresponding one of the connecting electrodes; and
    a light-emitting unit arranged on the driving backplane, wherein a side of the light-emitting unit facing the driving backplane comprises a plurality of bonding terminals, wherein each of the bonding terminals is electrically connected with a bump electrode, and the bump electrode is electrically connected with one of the connecting electrodes through corresponding one of the openings;
    wherein an orthographic projection of each of the openings projected on the driving backplane has a ridge and furrow profile, and an opening area of each of the openings gradually increases along a direction away from the driving backplane; and the ridge and furrow profile is one of or more than one of a square wave shape, a wave shape, and an arc shape.

2. The display panel according to claim 1, wherein an angle between a sidewall of each of the openings and the driving backplane ranges from 0 to 30 degrees.

3. The display panel according to claim 2, wherein a vertical height of the sidewall of each of the openings ranges from 0.5 to 10 microns.

4. The display panel according to claim 1, wherein the insulating layer further comprises at least two step surfaces with different heights, and the step surface is arranged around each of the openings.

5. The display panel according to claim 4, wherein the step surface is parallel to a plane of the driving backplane.

6. The display panel according to claim 4, wherein a step sidewall between adjacent two of the step surfaces is an inclined plane, and an angle between the step sidewall and the driving backplane ranges from 0 to 30 degrees.

7. The display panel according to claim 4, wherein a vertical height between adjacent two of the step surfaces ranges from 0.5 to 10 microns.

8. The display panel according to claim 1, wherein material of the insulating layer comprises an organic material.

9. A display panel comprises:
- a driving backplane comprising a plurality of connecting electrodes spaced apart from each other;
- an insulating layer arranged on the connecting electrodes, wherein the insulating layer comprises a plurality of openings, and wherein each of the openings exposes at least part of a surface of corresponding one of the connecting electrodes; and
- a light-emitting unit arranged on the driving backplane, wherein a side of the light-emitting unit facing the driving backplane comprises a plurality of bonding terminals, wherein each of the bonding terminals is electrically connected with a bump electrode, and the bump electrode is electrically connected with one of the connecting electrodes through corresponding one of the openings;
- wherein an orthographic projection of the opening projected on the driving backplane has a ridge and furrow profile.

10. The display panel according to claim 9, wherein an opening area of the opening gradually increases along a direction away from the driving backplane.

11. The display panel according to claim 10, wherein an angle between a sidewall of each of the openings and the driving backplane ranges from 0 to 30 degrees.

12. The display panel according to claim 11, wherein a vertical height of the sidewall of each of the openings ranges from 0.5 to 10 microns.

13. The display panel according to claim 10, wherein the insulating layer further comprises at least two step surfaces with different heights, and the step surface is arranged around each of the openings.

14. The display panel according to claim 13, wherein the step surface is parallel to a plane of the driving backplane.

15. The display panel according to claim 13, wherein a step sidewall between adjacent two of the step surfaces is an inclined plane, and an angle between the step sidewall and the driving backplane ranges from 0 to 30 degrees.

16. The display panel according to claim 13, wherein a vertical height between the two adjacent step surfaces ranges from 0.5 to 10 microns.

17. The display panel according to claim 9, wherein the ridge and furrow profile is one of or more than one of square wave shape, wave shape and arc shape.

18. The display panel according to claim 9, wherein material of the insulating layer comprises an organic material.

19. The display panel according to claim 18, wherein material of the bump electrode comprises any one of solder paste and silver glue.

20. The display panel according to claim 9, wherein a bottom wall of the opening is a surface of the connecting electrode exposed in the opening.

* * * * *